United States Patent
Liu et al.

(10) Patent No.: US 6,753,130 B1
(45) Date of Patent: Jun. 22, 2004

(54) RESIST REMOVAL FROM PATTERNED RECORDING MEDIA

(75) Inventors: Jianwei Liu, Fremont, CA (US); David Shiao-Min Kuo, Palo Alto, CA (US); Li-Ping Wang, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 59 days.

(21) Appl. No.: 10/047,105

(22) Filed: Jan. 17, 2002

Related U.S. Application Data

(60) Provisional application No. 60/323,200, filed on Sep. 18, 2001.

(51) Int. Cl.$^7$ ................................................ G03F 7/00
(52) U.S. Cl. .................... 430/313; 430/256; 430/311; 430/317; 430/329
(58) Field of Search ................................ 430/311, 313, 430/317, 329, 256

(56) References Cited

U.S. PATENT DOCUMENTS

| | | | | |
|---|---|---|---|---|
| 4,518,675 A | * | 5/1985 | Kataoka | 430/256 |
| 4,684,547 A | | 8/1987 | DiStefano et al. | 427/131 |
| 5,252,433 A | | 10/1993 | Fujioka et al. | 430/322 |
| 5,436,047 A | * | 7/1995 | Howard et al. | 428/64.2 |
| 5,681,426 A | | 10/1997 | Schultz et al. | 216/22 |
| 5,772,905 A | | 6/1998 | Chou | 216/44 |
| 5,830,332 A | * | 11/1998 | Babich et al. | 204/192.15 |
| 5,895,272 A | | 4/1999 | Li | 438/705 |
| 5,951,880 A | | 9/1999 | Chen et al. | 216/22 |
| 5,985,163 A | | 11/1999 | Cha et al. | 216/22 |
| 6,006,764 A | | 12/1999 | Chu et al. | 134/1.2 |
| 6,024,887 A | | 2/2000 | Kuo et al. | 216/48 |
| 6,045,715 A | | 4/2000 | Spierings et al. | 216/47 |
| 6,228,563 B1 | | 5/2001 | Starov et al. | 430/327 |
| 6,264,848 B1 | | 7/2001 | Belser et al. | 216/22 |

* cited by examiner

*Primary Examiner*—Nicole Barreca
(74) *Attorney, Agent, or Firm*—McDermott, Will & Emery

(57) ABSTRACT

A method for patterning a carbon-containing substrate utilizing a patterned layer of a resist material as a mask and then safely removing the mask from the substrate without adversely affecting the substrate, comprising sequential steps of:

(a) providing a substrate including a surface comprising carbon;
(b) forming a thin metal layer on the substrate surface;
(c) forming a layer of a resist material on the thin metal layer;
(d) patterning the layer of resist material;
(e) patterning the substrate utilizing the patterned layer of resist material as a pattern-defining mask; and
(f) removing the mask utilizing the thin metal layer as a wet strippable layer or a plasma etch/ash stop layer.

17 Claims, 3 Drawing Sheets

RESIST REMOVAL FROM PATTERNED RECORDING MEDIA

CROSS-REFERENCE TO PROVISIONAL APPLICATION

This application claims priority from U.S. provisional patent application Serial No. 60/323,200 filed Sep. 18, 2001, the entire disclosure of which is incorporated herein by reference.

FIELD OF THE INVENTION

The present invention relates to methods for safe, reliable, and efficient removal of patterned photoresist layers utilized in forming features and patterns in the surfaces of magnetic and/or magneto-optical (MO) recording media. The invention has particular utility in the formation of servo patterns, data tracks, identification numbers or symbols, etc., in high areal density hard disk magnetic data/information storage and retrieval media.

BACKGROUND OF THE INVENTION

Formation of patterned media has been considered and extensively studied as an approach for the development of high areal density magnetic data storage media, e.g., hard disks. A variety of patterning techniques for forming patterned magnetic media have been proposed and developed, including, inter alia, a number of processes widely employed in the fabrication of semiconductor integrated circuit (IC) devices, such as e-beam lithography, photolithography, sputter etching, reactive ion etching (RIE), ion beam etching (ion milling), electrolytic techniques, chemical-mechanical-polishing (CMP), etc. However, each of these processes is tedious and requires complex and expensive equipment, which requirement presents a significant cost disadvantage when utilized in large-scale manufacture of magnetic recording/data storage media, e.g., hard disks.

Of the above-enumerated approaches for patterning of magnetic media, patterning by ion irradiation, e.g., ion beam etching, milling, and implantation has shown great promise in achieving high areal density without incurring any substantial change in surface topography of the media. Pattern generation utilizing ion irradiation techniques is typically performed with the aid of stencil masks. While it has been demonstrated that ion irradiation through stencil masks can produce stable magnetic lines having widths less than about 50 nm, the technical difficulties involved in making stencil masks with sub-0.1 $\mu$m features over a large area, e.g., a 3"×3" square or 3" diameter disk, and the relatively short lifetime of the stencil masks, render this approach unfeasible from a commercial standpoint.

As utilized herein, the term or expression "patterned magnetic media" is taken as including thin film, high areal density, longitudinal or perpendicular magnetic media which are patterned to include at least one of a servo pattern, a data track pattern, and an identification number or symbol, as well as magnetic media comprising a large plurality of discrete magnetic nano-structures, e.g., columns or pillars of magnetic material.

Thin film magnetic media including discrete track and servo patterns are disclosed in, for example, U.S. Pat. No. 6,139,936, the entire disclosure of which is incorporated herein by reference. As disclosed therein, a method for increasing the areal density of thin film magnetic media in, e.g., hard disk form, involves patterning the surface of a thin film disk to form discrete data tracks. Such "discrete track media" typically include surface geometry data which are utilized by the hard disk drive servo mechanism, allowing specific recording tracks to be identified, and providing feedback for improving the accuracy of read/write head tracking.

Such discrete track media, however, suffer from several disadvantages, largely due to the fabrication methodology and resultant pattern structure. Specifically, the surface patterns of such discrete track media have generally been formed using standard lithographic techniques to remove material from the magnetic recording layer or by creating recessed zones or regions in the substrate prior to deposition of the magnetic thin film layer(s) thereon. In the former case, the magnetic recording material is etched, or ion milled, through a resist mask to leave a system or pattern of recesses which are devoid of magnetic material. In the latter case, the magnetic thin film layer(s) subsequently applied to the etched or ion milled substrate surface, is (are) spaced far enough away from the recording head such that the flux from the head does not sufficiently "write" the magnetic medium. Servo track information can be conveyed by the difference in magnetic flux at the boundary between the elevated and depressed regions.

Referring now to FIG. 1, shown therein, in simplified, schematic cross-sectional view, is a portion of a dual-sided, thin-film magnetic disk medium 1 of the type contemplated by the present invention, comprising a rigid, non-magnetic substrate 10, typically comprised of an aluminum (Al) alloy, e.g., Al-Mg. Alternative materials for use as substrate 10 include glass, ceramics, glass-ceramics composites and laminates, polymers, and other non-magnetic metals and alloys. Al-based substrate 10 is provided, in sequence, at both major surfaces, with a polished and/or textured amorphous Ni-P underlayer 12, a polycrystalline seed layer 14, typically a Cr-based layer deposited by sputtering, a magnetic layer 16 comprised of a ferromagnetic material, e.g., an oxide or a Co-based alloy, a protective overcoat layer 18, typically of a diamond-like carbon (DLC) material, and a lubricant topcoat layer 20, e.g., of a fluorine-containing polymer.

Adverting to FIG. 2, shown therein, in simplified, schematic plan view, is a magnetic recording disk 30 having a data zone 34 including a plurality of discrete servo tracks, and a contact start/stop (CSS) zone 32. A discrete servo pattern 40 is formed on or within the data zone 34, and includes a number of data track zones 38 separated by servo tracking zones 36. The data storage function of disk 30 is confined to the data track zones 38, while servo tracking zones 36 provide information to the disk drive which allows a read/write head to maintain alignment on the individual, tightly-spaced discrete data tracks.

Although only a relatively few of the servo tracking zones are shown in FIG. 2 for illustrative simplicity, it should be recognized that the discrete track patterns of the media contemplated herein may include several hundreds of servo zones to improve head tracking during each rotation of the disk. In addition, the servo tracking zones need not be straight radial zones as shown in the figure, but may instead , comprise arcs, intermittent zones, or irregularly-shaped zones separating individual data tracks.

Referring now to FIG. 3, shown therein in simplified, schematic perspective view, is an enlarged portion of a discrete servo track pattern 40 formed on or within the recording media thin film layer structure 41 (corresponding to layers 12–20 of FIG. 1), which in turn is disposed on the surface of substrate 42 for a discrete track medium (corresponding to substrate 10 of FIG. 1). The various elements or features of pattern 40 are generally defined by a difference in height between recessed zones or regions 44 and raised zones or regions 46. As illustrated, pattern 40 includes a pair of discrete track zones 38 separated by a servo tracking zone 36.

Servo tracking zone 36 generally includes track identification (ID) bars 50 and tracking position bars 52. ID bars 50 provide the identification for each of the discrete tracks 48 of the discrete track pattern 40. Tracking bars 52 provide the disk drive with feedback of the accuracy with which the read/write head is tracking a particular discrete track 48. Typically, tracking bars 52 extend to approximately the middle of the path defined by each track 48 and are staggered, so that each discrete track 48 includes at least one tracking bar 52 extending from the middle of the track path toward the axis of the disk, and one tracking bar 52 which extends radially outward from the middle of the track path.

A recently developed, low cost technique which can be utilized for forming a pattern in a substrate surface, e.g., a discrete track pattern 40 in the surface of a magnetic recording medium, is disclosed in U.S. Pat. No. 5,772,905, the disclosure of which is incorporated herein by reference. In essence, the thermal imprint lithographic technique disclosed therein, when applied to the manufacture of patterned magnetic media, involves etching or ion milling a magnetic recording layer or laminate of layers on a suitable substrate, utilizing a resist mask formed by thermal imprint lithography rather than optical (photo) lithography. A typical thermal imprint lithographic process for forming nano-dimensioned patterns/features in a surface of a thin film magnetic recording medium or a substrate therefor is illustrated with reference to the simplified, schematic cross-sectional views of FIGS. 4(A)–4(D).

Referring to FIG. 4(A), shown therein is a mold 60 (also known as a stamper or imprinter) including a main body 62 having upper and lower opposed surfaces, with a molding layer 64 (also referred to as an imprinting surface) formed on the lower opposed surface. As illustrated, molding layer 64 includes a plurality of features 66 having a desired shape or surface contour. A thin film magnetic recording medium 68 comprised of a stack of thin film layers on a substrate, or only the substrate therefor (also identified by reference numeral 68), either one carrying a thin film layer 70 on an upper surface thereof, is positioned below, and in facing relation to the molding layer 64. Thin film layer 70, comprised of a resist or thermoplastic polymer material, e.g., a polymethyl methacrylate (PMMA), may be formed on the substrate/workpiece surface by any appropriate technique, e.g., spin casting.

Adverting to FIG. 4(B), shown therein is a compressive molding step, wherein mold 60 is pressed into the thin film layer 70 in the direction shown by arrow 72, so as to form depressed, i.e., compressed, regions 74. In the illustrated embodiment, features 66 of the molding layer 64 are not pressed all of the way into the thin film layer 70 and thus do not contact the surface of the underlying magnetic medium or substrate 68. However, the top surface portions 74a of thin film 70 may contact depressed surface portions 66a of molding layer 64. As a consequence, the top surface portions 74a substantially conform to the shape of the depressed surface portions 66a, for example, flat. When contact between the depressed surface portions 66a of molding layer 64 and thin film layer 70 occurs, further movement of the molding layer 64 into the thin film layer 70 stops, due to the sudden increase in contact area, leading to a decrease in compressive pressure when the compressive force is constant.

FIG. 4(C) shows the cross-sectional surface contour of the thin film layer 70 following removal of mold 60. The molded, or imprinted, thin film layer 70 includes a plurality of recesses formed at compressed regions 74 which generally conform to the shape or surface contour of features 76 of the molding layer 64. Referring to FIG. 4(D), in a next step, the surface-molded workpiece comprising the magnetic medium or substrate 68 therefor is subjected to processing to remove the compressed portions 74 of thin film 70 to selectively expose portions 78 of the underlying magnetic medium or substrate 68 therefor, separated by raised features 76. Selective removal of the compressed portions 74 may be accomplished by any appropriate process, e.g., reactive ion etching (RIE) or wet chemical etching. The thus-patterned thin film layer 70 may subsequently be utilized as a mask for selective removal of the exposed substrate portions 78, after which the patterned thin film layer 70 is itself selectively removed, leaving a patterned magnetic medium or substrate 68 therefor.

The above-described imprint lithographic processing is capable of providing sub-micron-dimensioned features, such as the servo and data tracking features illustrated in FIG. 3, by utilizing a mold 60 provided with patterned features 66 comprising pillars, bars, holes, trenches, etc., by means of e-beam lithography, RIE, or other appropriate patterning method. Typical depths of features 66 range from about 5 to about 200 nm, depending upon the desired lateral dimension. The material of the molding layer 64 is typically selected to be hard relative to the thin film layer 70, the latter typically comprising a thermoplastic resist material which is softened when heated. Thus, suitable materials for use as the molding layer 64 include metals, dielectrics, semiconductors, ceramics, and composite materials. Suitable resist materials for use as thin film layer 70 include thermoplastic polymers which can be heated to above their glass temperature, $T_g$, such that the material exhibits low viscosity and enhanced flow.

A variant of the above-described thermal imprint lithographic patterning is made possible when ion irradiation (e.g., ion milling) is employed for pattern definition, such that the thickness-modulated thin film resist or mask layer 70, i.e., as shown in FIG. 4(C), is utilized as is for patterning the underlying magnetic recording medium or substrate 68 therefor, without removal of the compressed portions 74 for exposing the surface areas of the magnetic medium or substrate 68 therefor which are to receive patterning. According to this variant, upon irradiation with ions, e.g., as by ion beam etching or ion milling, the thicker portions 74a of the thickness-modulated mask layer 70 effectively block the ion flux and prevent removal of the underlying magnetic medium or substrate 68 therefor, whereas the ion flux is transmitted through the thinner, compressed portions 74 of the mask layer 70 for removal of the underlying magnetic medium or substrate 68 therefor to a selected depth, whereby the thickness modulation pattern of the mask layer 70 is transferred to the surface of the medium or substrate 68 therefor.

Still other methods for forming servo-patterns are known in the prior art. For example, U.S. Pat. No. 6,055,139 to Ohtsuka et al. discloses implanting a magnetic hard disk with chromium ions to change regions of the magnetic layer into non-magnetic regions. U.S. Pat. No. 4,556,597 to Best et al. discloses providing a magnetic recording disk substrate with a capacitive servo-pattern formed by implanting dopant species into the substrate to modify the conductivity thereof. U.K. Pat. 1,443,248 to Sargunar discloses magnetic recording media and fabrication methods therefor by forming low coercivity regions therein by implantation of chromium ions. However, it is believed that the use of such metal ions adversely affects the magnetic layer.

Commonly assigned, co-pending U.S. patent application Ser. No. 09/912,065, filed Jul. 25, 2001, by the present inventors, the entire disclosure of which is incorporated herein by reference, discloses an improved method for forming servo patterns in high areal density, thin film magnetic recording media, without incurring variations or changes in media surface topography, and servo-patterned thin film magnetic recording media obtained thereby, in which nitrogen ions or heavier ions of at least one inert gas having an atomic weight of at least 35 (e.g., Ar ions) are selectively implanted (at appropriate dosages and energies) into regions of a thin film magnetic recording layer exposed through a pattern of openings in an apertured mask (e.g., in the form of a stencil or resist layer formed according to the above-described imprint lithography process) overlying the surface of the magnetic recording layer, the pattern of openings in the apertured mask corresponding to a desired servo pattern of lower coercivity regions to be formed in the magnetic layer, whereby, for example, the coercivity ($H_c$) and magnetic remanence-thickness product (Mrt) of the ion-implanted regions can be controllably and reproducibly reduced by a desired amount. For example, implantation of argon ions at appropriate dosages and energies can reduce an initial value of $H_c$ which is as high as about 4,000 Oe, to as low as about 200 Oe and reduce an initial value of Mrt of which is as high as about 0.40, to as low as about 0.15 memu; whereas implantation of nitrogen ions generally results in smaller reductions in $H_c$ and Mrt values.

However, a significant problem is associated with each of the above-described ion irradiation techniques for patterning, regardless of whether or not the compressed portions 74 of the mask layer 70 are removed prior to patterning of the magnetic recording medium or substrate 68 therefor. Specifically, according to this approach, virtually all commonly utilized thermoplastic polymeric resist materials experience significant changes in their chemical and/or physical properties upon subjection to ion irradiation, which changes typically include, inter alia, cross-linking of the polymeric material leading to difficulty in mask removal subsequent to patterning. The problem of mask removal subsequent to patterning is exacerbated when, as in the present instance, the mask layer is applied atop a thin film laminate including a magnetic recording layer and a carbon (C)-based protective overcoat layer, for the reasons given below.

While the above-described problem of mask removal subsequent to patterning is particularly troublesome when ion irradiation, e.g., ion beam etching, milling, or implantation is utilized for pattern definition in the underlying substrate, similar difficulty in mask removal is experienced to a varying degree with other commonly employed processes for material removal, such as reactive ion etching, plasma etching, etc., due to chemical and/or physical changes, e.g., cross-linking, of the polymer material of the resist layer forming the patterned mask. Moreover, currently employed dry-type photoresist stripping processes involving ashing of the resist in a reactive plasma, e.g., oxygen-containing plasmas, involve several shortcomings and drawbacks, including inter alia, excessively long intervals required for completion of the stripping process and detrimental effects on the magnetic properties of the media unless proper media protection techniques are utilized. The cause of the latter drawback has been determined as the inability of the oxygen ashing process to differentiate between the carbon-containing photoresist and the underlying carbon-containing protective overcoat layer. As a consequence, stripping of both the photoresist and at least portions of the underlying protective overcoat layer may occur during a typical oxygen ashing step, whereby the underlying thin film magnetic recording layer(s) is (are) exposed to the oxygen plasma for an interval sufficient to result in degradation of the magnetic properties thereof. Further, since at least a portion of the carbon-containing protective overcoat is stripped by the oxygen ashing process, it must be re-deposited/repaired subsequent to the resist removal step, thereby adding considerable cost to the manufacturing process.

In view of the above, there exists a need for methods and instrumentalities for safe, reliable, and efficient removal of the patterned masking layer subsequent to patterning of the substrate, which methods are effective irrespective of any alteration in the chemical and/or physical properties of the mask material resulting from the substrate patterning process, and with no, or at least minimal, deleterious impact or effect on the underlying layer(s) of the magnetic medium. Moreover, there exists a need for methods and instrumentalities for performing rapid, cost effective removal of mask layers subsequent to substrate patterning, which methods are fully compatible with the requirements of automated magnetic or magneto-optical (MO) disk manufacturing technology.

The present invention addresses and solves the above-described problems and difficulties, such as degradation of magnetic properties, due to coincident removal of the carbon-based protective overcoat layer attendant upon the use of oxygen plasma ashing techniques and methodologies for resist removal subsequent to pattern definition in magnetic thin film layers for forming patterned thin film magnetic or MO data storage media, while maintaining full capability with all aspects of conventional automated manufacturing technology for patterned media formation. Further, the methodology and means afforded by the present invention enjoy diverse utility in patterning of a variety of workpieces and substrates comprising carbon-containing layers.

DISCLOSURE OF THE INVENTION

An advantage of the present invention is an improved method for safely removing a patterned resist-based masking layer from a carbon-containing substrate without adversely affecting the substrate.

Another advantage of the present invention is an improved method for manufacturing a patterned recording medium such as a magnetic or magneto-optical (MO) recording medium.

Still another advantage of the present invention is an improved structure for use in the manufacture of a patterned magnetic or magneto-optical (MO) recording medium.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method for patterning a carbon-containing substrate utilizing a patterned layer of a resist material as a mask and then safely removing the mask from the substrate without adversely affecting the substrate, the method comprising the sequential steps of:

(a) providing a substrate including a surface comprising carbon;
(b) forming a thin metal layer on the substrate surface;
(c) forming a layer of a resist material on the thin metal layer;
(d) patterning the layer of resist material;
(e) patterning the substrate utilizing the patterned layer of resist material as a pattern-defining mask; and
(f) removing the mask utilizing the thin metal layer as a wet strippable layer or as a plasma etch/ash stop layer.

According to embodiments of the present invention, step (a) comprises providing a substrate comprising a plurality of thin film layers covered by a carbon-containing protective overcoat layer, e.g., step (a) comprises providing a thin film magnetic or magneto-optical (MO) recording medium and the carbon-containing protective overcoat layer comprises at least one material selected from amorphous hydrogenated and/or nitrogenated carbon, ion-beam deposited (IBD) hydrogenated and/or nitrogenated carbon, plasma enhanced chemical vapor-deposited (PECVD) hydrogenated and/or nitrogenated carbon, and diamond-like carbon (DLC); step (b) comprises forming an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides; step (c) comprises forming a layer of a carbon-containing resist material, e.g., step (c) comprises forming a layer of a thermoplastic resist material, e.g., polymethyl methacrylate (PMMA); step (d) comprises forming a patterned plurality of recesses in the surface of the layer of resist material, the recesses extending at least partway through the thickness of the layer of resist material to form a mask defining a corresponding plurality of portions of the substrate surface, e.g., step (d) comprises subjecting the layer of resist material to at least one of thermal imprint lithography, wet chemical etching, and dry etching by means of ion irradiation; and step (e) comprises selectively removing substrate material from portions of the substrate defined by the resist mask or selectively ion irradiating or implanting the portions of the substrate defined by the resist mask to alter the magnetic properties thereof, e.g., to form a servo pattern in a magnetic or magneto-optical (MO) recording medium.

In accordance with certain embodiments of the present invention, step (f) comprises removing the resist mask and the thin metal layer in a single step stripping process utilizing a wet chemical etchant for the thin metal layer which undercuts and lifts off the mask, wherein step (b) comprises forming a thin Al layer on the substrate surface; and step (f) comprises removing the mask and the thin metal layer in a single step stripping process utilizing an aqueous solution of a base.

According to certain other embodiments of the present invention, step (f) comprises removing the resist mask and the thin metal layer in a two-step process comprising first removing the mask by means of a plasma etching/ashing process utilizing the thin metal layer as an etch stop layer and then removing the thin metal layer by means of a wet chemical removal process, wherein step (b) comprises forming a thin Al layer on the substrate surface; and step (f) comprises first removing the mask by ashing in an oxygen-containing plasma and then stripping the Al layer by washing with an aqueous solution of a base.

Another aspect of the present invention is a method of manufacturing a patterned recording medium, comprising sequential steps of:

(a) providing a substrate in the form of a magnetic or magneto-optical (MO) recording medium, the medium comprising a stacked plurality of thin film layers including at least one magnetic recording layer and an uppermost, carbon-containing protective overcoat layer at the surface of the substrate, comprising at least one material selected from amorphous hydrogenated and/or nitrogenated carbon, ion-beam deposited (IBD) hydrogenated and/or nitrogenated carbon, plasma enhanced chemical vapor-deposited (PECVD) hydrogenated and/or nitrogenated carbon, and diamond-like carbon (DLC);
(b) forming an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides on the uppermost, carbon-containing protective overcoat layer;
(c) forming a layer of a carbon-containing resist material on the thin metal layer;
(d) forming a patterned plurality of recesses in the surface of the layer of resist material, the recesses extending at least partway through the thickness of the layer of resist material to define a corresponding plurality of portions of the substrate surface, wherein step (d) comprises subjecting the layer of resist material to at least one process selected from thermal imprint lithography, wet chemical etching, and dry etching by means of ion irradiation;
(e) patterning the substrate utilizing the patterned layer of resist material as a pattern-defining mask for forming a servo pattern in the medium, wherein step (e) comprises selectively removing substrate material from portions of the substrate defined by the resist mask or selectively ion irradiating or implanting the portions of the substrate surface defined by the mask to alter the magnetic properties thereof; and
(f) removing the mask and the thin metal layer in a single step stripping process utilizing a wet chemical etchant for the thin metal layer which undercuts and lifts off the mask or removing the mask and the thin metal layer in a two-step process comprising first removing the mask by means of a plasma etching/ashing process utilizing the thin metal layer as an etch stop layer and then removing the thin metal layer by means of a wet chemical removal process.

According to certain embodiments of the present invention, step (b) comprises forming a thin Al layer on the substrate surface; and step (f) comprises removing the mask and the thin metal layer in a single step stripping process utilizing an aqueous solution of a base; whereas according to certain other embodiments of the present invention, step (b) comprises forming a thin Al layer on the substrate surface; and step (f) comprises first removing the mask by ashing in an oxygen-containing plasma and then stripping the Al layer by washing with an aqueous solution of a base.

Still another aspect of the present invention is a structure for use in the manufacture of a patterned magnetic or magneto-optical (MO) recording medium, comprising:

(a) a substrate comprising a stacked plurality of thin film layers including at least one magnetic recording layer and an uppermost, carbon-containing protective overcoat layer at the surface of the substrate; and
(b) means for protecting the carbon-containing protective overcoat layer during resist removal therefrom as part of the process for manufacturing the patterned medium.

According to an embodiment of the present invention, means (b) comprises an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides on said uppermost, carbon-containing protective overcoat layer.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the same reference numerals are employed throughout to designate the same or similar features and wherein the various features are not necessarily drawn to scale but rather are drawn as to best illustrate the pertinent aspects and features, wherein.

DESCRIPTION OF THE INVENTION

Figure 1:
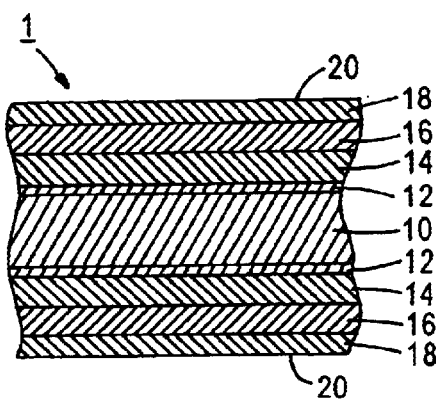
FIG. 1 is a simplified, schematic cross-sectional view, of a portion of a dual-sided, thin-film magnetic disk medium of the type contemplated for use in the present invention.
Figure 2:
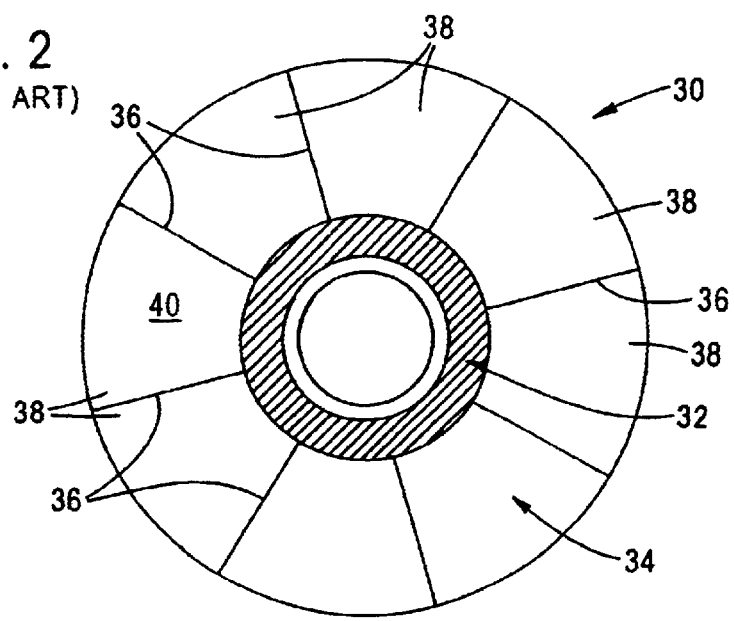
FIG. 2 is a simplified, schematic plan view of a magnetic recording disk according to the present invention, including a data zone having a plurality of discrete servo tracks, and a contact start/stop (CSS) zone.
Figure 3:
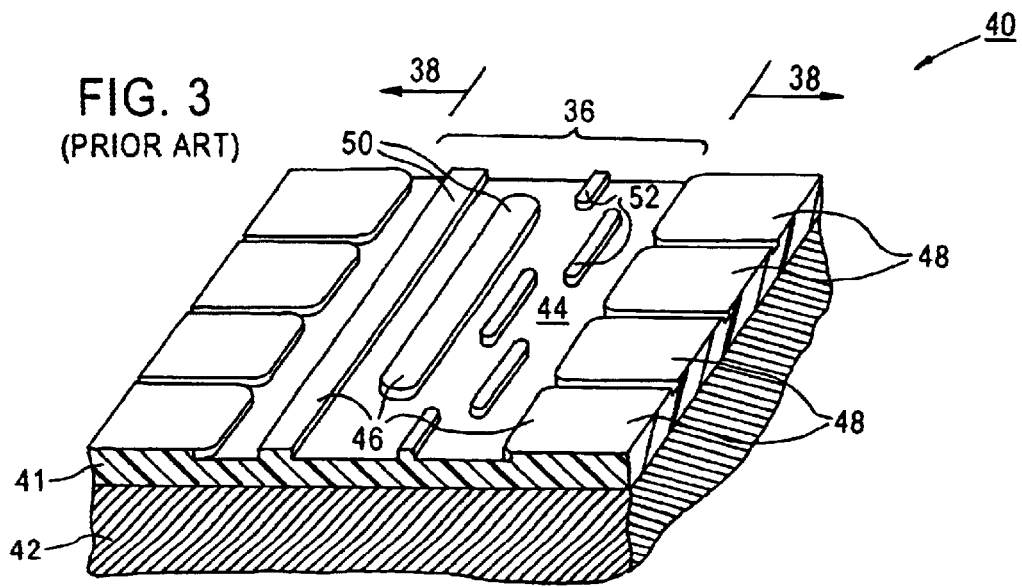
FIG. 3 is a simplified, schematic perspective view of an enlarged portion of a discrete servo track pattern formed on or within a recording medium of thin film layer structure.

The present invention addresses and solves problems attendant upon the use of patterned masks, i.e., polymer-based resist masks, when performing patterning of substrates, e.g., substrates comprising thin film magnetic or magneto-optical (MO) recording media in hard disk form, for forming sub-micron-dimensioned servo patterns, data track patterns, disk identification, etc., and is based upon the discovery that removal of such polymer-based masks subsequent to patterning processing may be advantageously implemented in a rapid, safe, and efficient manner, regardless of any changes in the chemical and/or physical properties of the polymeric mask material which may have occurred as a result of the patterning processing.

More specifically, the present invention addresses and solves problems associated with currently employed dry-type photoresist stripping processes involving ashing of the resist in a reactive plasma, e.g., oxygen-containing plasmas, which plasma ashing process is utilized in view of the difficulty experienced with a number of other resist removal techniques in removing polymer-based photoresist masks when the chemical and/or physical properties of the latter have been altered as a result of having been subjected to ion irradiation during the patterning process. In particular, ashing of polymer-based photoresist layers in oxygen-containing plasmas for resist stripping purposes incurs several shortcomings and drawbacks, including excessively long intervals required for completion of the stripping process and detrimental effects on the magnetic properties of the media unless proper media protection techniques are utilized. The latter drawback is of particular significance in the manufacture of patterned thin film magnetic and/or MO recording media and arises mainly from the inability of the oxygen ashing process to differentiate between the carbon-containing photoresist and the underlying carbon-containing protective overcoat layer typically forming the uppermost layer of the media. As a consequence, stripping of both the photoresist and at least portions of the underlying protective overcoat layer typically occurs during the oxygen plasma ashing step, whereby the underlying thin film magnetic recording layer(s) is (are) exposed to the oxygen plasma for an interval sufficient to result in degradation of the magnetic properties thereof. Further, since at least a portion of the carbon-containing protective overcoat is stripped by the oxygen ashing process, it must be re-deposited/repaired subsequent to the resist removal step, thereby adding considerable cost to the manufacturing process.

The present invention, therefore, has been made with the aim of eliminating the above-described difficulties associated with oxygen plasma ashing and involves interposition of a thin metal layer between the carbon-containing surface of the substrate (workpiece) to be patterned and the polymer-based resist layer, wherein the process for removal of the resist mask subsequent to processing for patterning the media comprises either removing the resist mask and the thin metal layer in a single step stripping process utilizing a wet chemical etchant for the thin metal layer which undercuts and lifts off the mask or removing the mask and the thin metal layer in a two-step process comprising first removing the mask by means of a plasma etching/ashing process utilizing the thin metal layer as an etch stop layer and then removing the thin metal layer by means of a wet chemical removal process. According to either alternative process according to the invention, the resist mask is rapidly, safely, and efficiently removed without incurring damage to or loss of portions of the carbon-containing protective overcoat layer and concomitant adverse effects on the magnetic properties of the underlying magnetic recording layer(s).

Figure 4A:
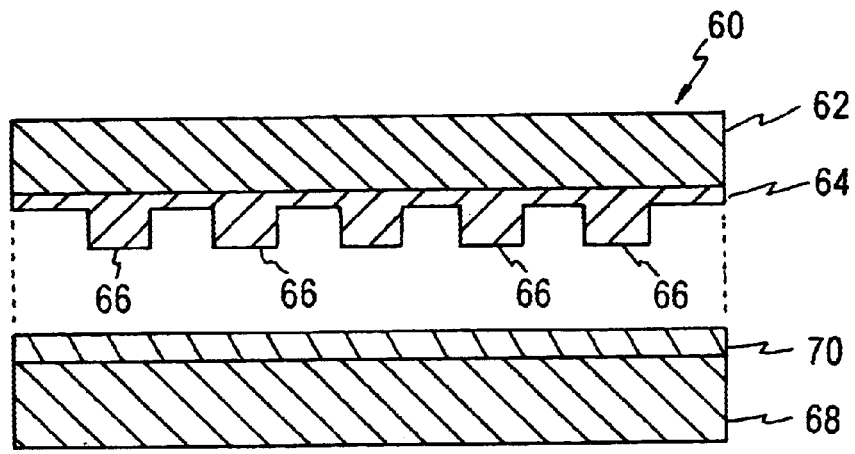
FIGS. 4(A)–4(D) are simplified, schematic cross-sectional views illustrating a process sequence for performing thermal imprint lithography of a thin resist film on a substrate (workpiece) according to the conventional art.
Figure 4B:
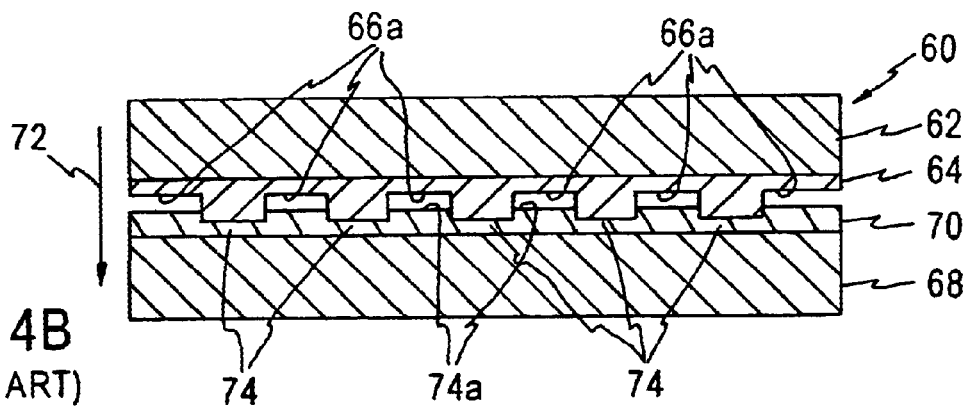
Figure 4C:
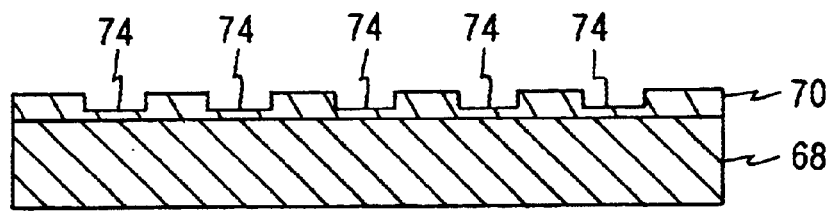
Figure 4D:
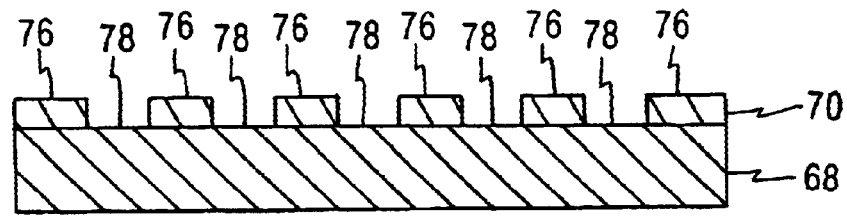
Figure 5:
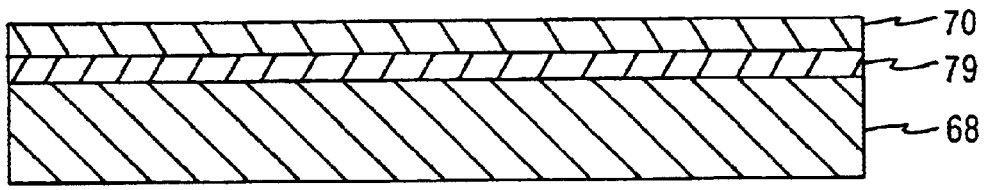
FIG. 5 is a simplified, schematic cross-sectional view of the workpiece of FIGS. 4(A)–4(D) modified according to the inventive principle to include a thin metal layer intermediate the upper surface of a workpiece and an overlying resist layer.

Adverting to FIG. 5, illustrated therein is a simplified, schematic cross-sectional view of the workpiece 68 of the conventional process of FIGS. 4(A)–4(D) which has been modified according to the inventive principle to include a thin metal layer 79 intermediate the upper surface of workpiece 68 and overlying resist layer 70. According to the invention, thin metal layer 79 comprises an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides, which layer 79 is formed, by means of any suitable technique, e.g., sputtering, vacuum evaporation, etc., on the upper surface of workpiece 68 (e.g., a thin film magnetic recording medium such as illustrated in FIG. 1 comprising an uppermost carbon-containing protective overcoat layer 18) prior to formation thereon of thin film layer 70 of resist or thermoplastic polymer material (e.g., polymethyl methacrylate, PMMA), as by spin casting.

According to the invention, subsequent processing for patterning of the thus-formed workpiece 68 with overlying thin metal and resist or thermoplastic polymer layers 79, 70 respectively, comprises patterning of the resist or thermoplastic polymer layer 70 by any of the aforementioned techniques, i.e., wet chemical or dry etching (plasma, ion irradiation, etc.), or by thermal imprint lithography as illustrated in FIG. 4, to form a mask including a patterned plurality of recesses extending at least partway through the thickness of resist, or thermoplastic polymer layer 70, depending upon the particular technique utilized for patterning workpiece 68. Thus, according to certain embodiments of the present invention, e.g., as shown in FIG. 4(C), the recesses may comprise a plurality of compressed portions 74 of resist or thermoplastic polymer layer 70, and the recesses 74 may or may not receive further treatment for removal of the remaining compressed portions of layer 70 (and possible removal of the respective underlying portions of thin metal layer 79.

In accordance with certain embodiments of the invention, patterning, e.g., servo patterning, of the workpiece 68 is then performed by selectively removing portions 78 (see FIG. 4(D)) of the surface of workpiece 68 corresponding to the recesses 74 of the mask 70, e.g., by means of a wet chemical etching process or a dry process such as sputter etching, reactive ion etching, ion beam etching, ion milling, etc., whereas, according to certain other embodiments of the invention, e.g., as when the plurality of recesses extend only partway through the thickness of the layer of resist or thermoplastic polymer material, patterning of the workpiece 68 is performed by selectively irradiating or implanting ions into the portions of the workpiece surface located below the thin portions of the resist layer to alter the magnetic properties of the thin film magnetic recording layer(s) thereat.

Following patterning of workpiece 68, according to the invention, mask 70 and underlying thin metal layer 79 are removed by either of two alternative processes: (1) removal of the resist mask and the thin metal layer in a single step stripping process utilizing a wet chemical etchant for the thin metal layer which undercuts and lifts off the mask, or (2) removing the mask and the thin metal layer in a two-step process comprising first removing the mask by means of a plasma etching/ashing process utilizing the thin metal layer as an etch stop layer and then removing the thin metal layer by means of a wet chemical removal process.

As for alternative (1), use of a thin layer of Al is preferred, which Al layer is readily removed (i.e., undercut) by ultrasonic washing in an aqueous solution of a base (e.g., NaOH) to effect lift-off of the overlying resist mask layer in a single step process; whereas for alternative (2), in a first step the resist mask layer is removed by plasma ashing in an oxygen-containing atmosphere, with an underlying thin layer of Al acting as an etch stop, a barrier to oxidation of the underlying magnetic layer(s), and permitting use of a prolonged plasma ashing interval, followed by a second step wherein the Al layer is removed by washing with an aqueous solution of a base (e.g., NaOH). By way of illustration only, a typical set of plasma ashing conditions may include application of about 450 W RF power for about 8 min. in an oxygen-containing atmosphere at an $O_2$ flow rate of about 15 sccm.

Each of the alternative resist removal processes (1) and (2) can be performed in rapid and cost-effective manner to safely remove the mask layer without incurring removal of or damage to the carbon-containing protective overcoat layer at the surface of workpiece 68, hence without adversely affecting the magnetic properties of the underlying magnetic recording layer(s) of the recording medium comprising the workpiece.

EXAMPLE

The following Example illustrates the efficacy of the invention when the thin metal layer provided between the carbon-containing substrate (workpiece) and an imprinted and ion-implanted resist mask layer comprises 30 Å of Al and a 1 N aqueous solution of NaOH is utilized for single step removal of the mask layer and the Al layer according to alternative process (1).

Thin film magnetic media in hard disk form and having an uppermost, carbon-containing protective overcoat layer were coated with a 30 Å layer of Al by sputtering and an about 1,500 Å thick layer of a thermoplastic polymer resist (PMMA), and then subjected to thermal imprint lithography and ion implantation processing as described above to form servo-patterned magnetic recording media. The patterned media were then subjected to ultrasonic washing in an aqueous 1 N NaOH solution at about 25° C. for about 30 min. The resist mask layer was observed to disintegrate into fine flakes as the underlying Al layer was etched away in the ultrasonic 1 N NaOH bath.

A comparison of ESCA results giving the elemental composition, in at. %, of the top 50 Å of unprocessed disks coated with a 30 Å thick layer of Al and the top 50 Å of disks where an initially 30 Å thick Al layer has been subjected to ultrasonic washing with aqueous 1 N NaOH or aqueous 1 N HCl, is presented in Table I below.

TABLE I

| Disk | C | O | N | F | Al |
| --- | --- | --- | --- | --- | --- |
| 30 Å Al (not washed) | 16 | 58 | 0.9 | 0.8 | 24 |
| Washed in 1 N NaOH | 69 | 12 | 9.1 | 8.6 | <0.5 |
| Washed in 1 N HCl | 52 | 30 | 5.8 | 3.5 | 8.7 |

Figure 6:
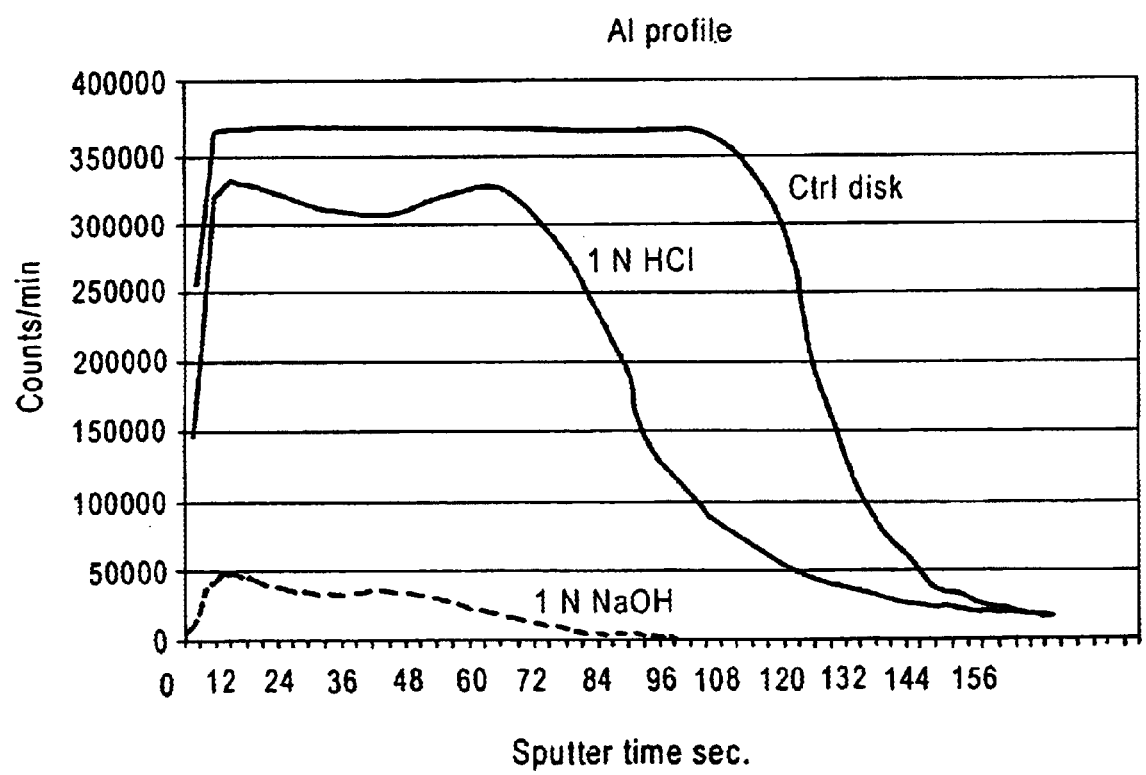
FIG. 6 is a graph illustrating surface surveys by TOF-SIMS of magnetic disk samples processed according to the invention.

The results shown in Table I indicate that removal of the Al layer in an ultrasonic 1 N NaOH bath is essentially complete after 30 min., with the HCl ultrasonic bath being less effective. A similar conclusion pertaining to the relative efficacy of 1 N NaOH and 1 N HCl can be drawn from the graph of FIG. 6 showing results of a surface survey of the above disks by TOF-SIMS.

Thus, the inventive methodology provides for the rapid, cost-effective, and safe removal of patterned resist or mask layers from workpiece/substrate surfaces subsequent to patterning of the latter, as in the manufacture of high areal density, patterned magnetic media, e.g., hard disks, which method is applicable irrespective of any chemical and/or physical changes incurred by the resist or mask layer material in the course of patterning processing. Moreover, the inventive methodology is not limited to use as described above in the illustrated examples; rather, the invention can be practiced with a wide variety of substrates/workpieces, such as, for example, semiconductor substrates utilized in integrated circuit (IC) device manufacture, and the imprinted patterns capable of being formed by the invention are not limited to servo patterns, data tracks, identification, etc., for magnetic recording media, and may, for example, include metallization patterns of semiconductor IC devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method for patterning a carbon-containing substrate utilizing a patterned layer of a resist material as a mask and then safely removing said mask from said substrate without adversely affecting said substrate, said method comprising the sequential steps of:

(a) providing a substrate including a surface comprising carbon, said substrate comprising a plurality of thin film layers;

(b) forming a thin metal layer on said substrate surface;

(c) forming a layer of a carbon-containing resist material on said thin metal layer;

(d) patterning said layer of resist material;

(e) patterning said substrate utilizing the patterned layer of resist material as a pattern-defining mask; and (f) removing said mask utilizing said thin metal layer as a wet strippable layer or as a plasma etch/ash stop layer.

2. The method according to claim 1, wherein:

step (a) comprises providing a substrate comprising a plurality of thin film layers covered by a carbon-containing protective overcoat layer.

3. The method according to claim 2, wherein:

step (a) comprises providing a thin film magnetic or magneto-optical (MO) recording medium and said carbon-containing protective overcoat layer comprises at least one material selected from amorphous hydrogenated and/or nitrogenated carbon, ion-beam deposited (IBD) hydrogenated and/or nitrogenated carbon, plasma enhanced chemical vapor-deposited (PECVD) hydrogenated and/or nitrogenated carbon, and diamond-like carbon (DLC).

4. The method according to claim 1, wherein:

step (b) comprises forming an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides.

5. The method according to claim 1, wherein:

step (c) comprises forming a layer of a thermoplastic resist material.

6. The method according to claim 1, wherein:

step (d) comprises forming a patterned plurality of recesses in the surface of said layer of resist material, said recesses extending at least partway through the thickness of said layer of resist material to define a corresponding plurality of portions of said substrate surface.

7. The method according to claim 6, wherein:

step (d) comprises subjecting said layer of resist material to at least one of thermal imprint lithography, wet chemical etching, and dry etching by means of ion irradiation.

8. The method according to claim 1, wherein:

step (e) comprises selectively removing substrate material from portions of said substrate defined by said mask.

9. The method according to claim 1, wherein:

step (e) comprises selectively ion irradiating or implanting the portions of said substrate defined by said mask to alter the magnetic properties thereof.

10. The method according to claim 1, wherein:

step (e) comprises forming a servo pattern in a magnetic or magneto-optical (MO) recording medium.

11. The method according to claim 1, wherein:

step (f) comprises removing said resist mask and said thin metal layer in a single step stripping process utilizing a wet chemical etchant for said thin metal layer which undercuts and lifts off said mask.

12. The method according to claim 11, wherein:

step (b) comprises forming a thin Al layer on said substrate surface; and step (f) comprises removing said mask and said thin metal layer in a single step stripping process utilizing an aqueous solution of a base.

13. The method according to claim 1, wherein:

step (f) comprises removing said mask and said thin metal layer in a two-step process comprising first removing said mask by means of a plasma etching/ashing process utilizing said thin metal layer as an etch stop layer and then removing said thin metal layer by means of a wet chemical removal process.

14. The method according to claim 13, wherein:

step (b) comprises forming a thin Al layer on said substrate surface; and step (f) comprises first removing said mask by ashing in an oxygen-containing plasma and then stripping said Al layer by washing with an aqueous solution of a base.

15. A method of manufacturing a patterned recording medium, comprising sequential steps of:

(a) providing a substrate in the form of a magnetic or magneto-optical (MO) recording medium, said medium comprising a stacked plurality of thin film layers including at least one magnetic recording layer and an uppermost, carbon-containing protective overcoat layer at the surface of said substrate, comprising at least one material selected from amorphous hydrogenated and/or nitrogenated carbon, ion-beam deposited (IBD) hydrogenated and/or nitrogenated carbon, plasma enhanced chemical vapor-deposited (PECVD) hydrogenated and/or nitrogenated carbon, and diamond-like carbon (DLC);

(b) forming an about 10 to about 200 Å thick layer of a material selected from the group consisting of Al, Cr, Zn, Cu, Ni, Ti, Co, Ge, Ge—Se, Al—Ti, Mg—Ag, Ca—Ag, and their oxides on said uppermost, carbon-containing protective overcoat layer;

(c) forming a layer of a carbon-containing resist material on said thin metal layer;

(d) forming a patterned plurality of recesses in the surface of said layer of resist material, said recesses extending at least partway through the thickness of said layer of resist material to define a corresponding plurality of portions of said substrate surface, wherein step (d) comprises subjecting said layer of resist material to at least one process selected from thermal imprint lithography, wet chemical etching, and dry etching by means of ion irradiation;

(e) patterning said substrate utilizing the patterned layer of resist material as a pattern-defining mask for forming a servo pattern in said medium, wherein step (e) comprises selectively removing substrate material from portions of said substrate defined by said mask or selectively ion irradiating or implanting portions of said substrate surface defined by said mask to alter the magnetic properties thereof; and (f) removing said mask and said thin metal layer in a single step stripping process utilizing a wet chemical etchant for said thin metal layer which undercuts and lifts off said mask or removing said mask and said thin metal layer in a two-step process comprising first removing said mask by means of a plasma etching/ashing process utilizing said thin metal layer as an etch stop layer and then removing said thin metal layer by means of a wet chemical removal process.

16. The method according to claim 15, wherein:

step (b) comprises forming a thin Al layer on said substrate surface; and step (f) comprises removing said mask and said thin metal layer in a single step stripping process utilizing an aqueous solution of a base.

17. The method according to claim 15, wherein:

step (b) comprises forming a thin Al layer on said substrate surface; and step (f) comprises first removing said mask by ashing in an oxygen-containing plasma and then stripping said Al layer by washing with an aqueous solution of a base.

* * * * *